（12） United States Patent
Gershon et al.

(10) Patent No.: US 9,722,120 B2
(45) Date of Patent: Aug. 1, 2017

(54) BANDGAP GRADING OF CZTS SOLAR CELL

(71) Applicant: INTERNATIONAL BUSINESS MACHINES CORPORATION, Armonk, NY (US)

(72) Inventors: Talia S. Gershon, White Plains, NY (US); Marinus J. P. Hopstaken, Carmel, NY (US); Jeehwan Kim, Cambridge, MA (US); Yun Seog Lee, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/853,463

(22) Filed: Sep. 14, 2015

(65) Prior Publication Data

US 2017/0077337 A1    Mar. 16, 2017

(51) Int. Cl.
*H01L 31/032* (2006.01)
*H01L 31/0368* (2006.01)
*H01L 31/065* (2012.01)
*H01L 31/18* (2006.01)

(52) U.S. Cl.
CPC ........ *H01L 31/065* (2013.01); *H01L 31/0326* (2013.01); *H01L 31/0368* (2013.01); *H01L 31/1864* (2013.01)

(58) Field of Classification Search
CPC ... H01L 31/0326; H01L 31/0327; C23C 8/60; C23C 8/62; C23C 10/28; C23C 10/30; C23C 24/06
See application file for complete search history.

(56) References Cited

U.S. PATENT DOCUMENTS

| | | | |
|---|---|---|---|
| 8,372,685 B2 | 2/2013 | Robinson et al. | |
| 8,415,559 B2 | 4/2013 | Basol | |
| 2008/0305247 A1 * | 12/2008 | Von Klopmann | ........ H01L 21/67109 427/74 |
| 2009/0226717 A1 | 9/2009 | Basol | |
| 2012/0167979 A1 | 7/2012 | Perng et al. | |
| 2013/0037090 A1 | 2/2013 | Bag et al. | |

(Continued)

FOREIGN PATENT DOCUMENTS

| | | | | |
|---|---|---|---|---|
| FR | WO 2014023560 A1 * | 2/2014 | ......... | H01L 31/0326 |
| KR | 1020110128580 A | 11/2011 | | |
| KR | WO 2013191451 A1 * | 12/2013 | ......... | H01L 31/0326 |

OTHER PUBLICATIONS

Definition of "size" [retrieved from http://www.thefreedictionary.com/size on Dec. 28, 2016].*

(Continued)

*Primary Examiner* — Eric R Smith
(74) *Attorney, Agent, or Firm* — Tutunjian & Bitetto, P.C.; Louis J. Percello

(57) ABSTRACT

A method for fabricating a photovoltaic device includes forming a polycrystalline absorber layer including Cu—Zn—Sn—S(Se) (CZTSSe) over a substrate. The absorber layer is rapid thermal annealed in a sealed chamber having elemental sulfur within the chamber. A sulfur content profile is graded in the absorber layer in accordance with a size of the elemental sulfur and an anneal temperature to provide a graduated bandgap profile for the absorber layer. Additional layers are formed on the absorber layer to complete the photovoltaic device.

14 Claims, 5 Drawing Sheets

(56) References Cited

U.S. PATENT DOCUMENTS

| | | | |
|---|---|---|---|
| 2013/0213478 A1 | 8/2013 | Munteanu et al. | |
| 2013/0217176 A1* | 8/2013 | Munteanu | C23C 16/56 |
| | | | 438/95 |
| 2013/0269783 A1* | 10/2013 | Berg | C23C 14/0623 |
| | | | 136/264 |
| 2014/0041722 A1 | 2/2014 | Liang et al. | |
| 2014/0073082 A1* | 3/2014 | Song | H01L 21/02568 |
| | | | 438/95 |
| 2014/0158190 A1 | 6/2014 | Liang et al. | |
| 2014/0182665 A1 | 7/2014 | Liang | |
| 2014/0326317 A1 | 11/2014 | Gwak et al. | |
| 2014/0338736 A1* | 11/2014 | Yun | H01L 31/0326 |
| | | | 136/255 |
| 2015/0214401 A1* | 7/2015 | Grenet | H01L 31/0326 |
| | | | 136/255 |

OTHER PUBLICATIONS

Kobayashi, T. et al., "Impacts of surface sulfurization on Cu(In1x,Gax)Se2 thin-film solar cells," Progress in Photovoltaics: Research and Applications, Oct. 2014. (pp. 1-8).

Olopade, M. et al., "Effect of band gap grading on the performance characteristics of CU2ZnSnS4 solar cell," IEEE 40th Photovoltaic Specialist Conference (PVSC), Jun. 2014. (pp. 1-3).

* cited by examiner

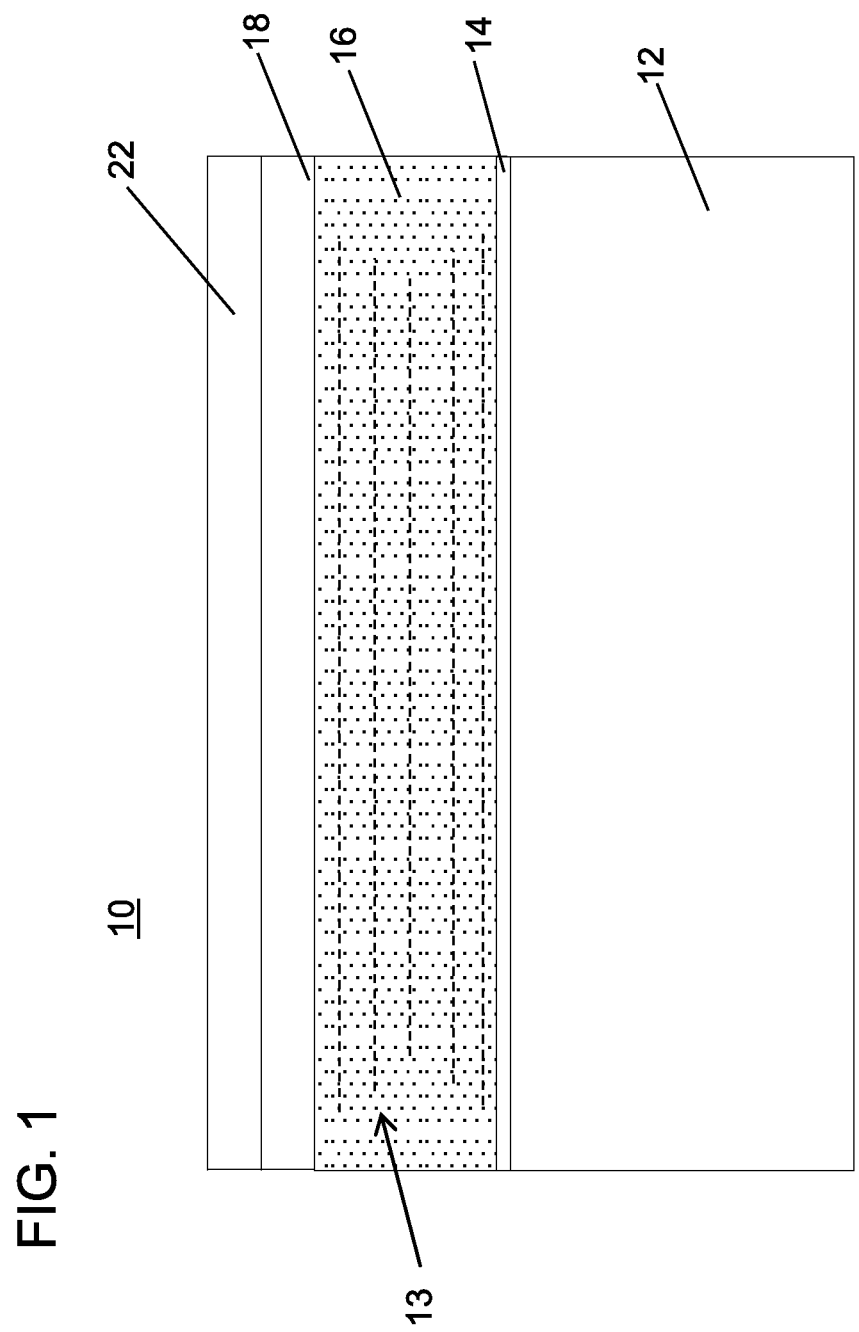

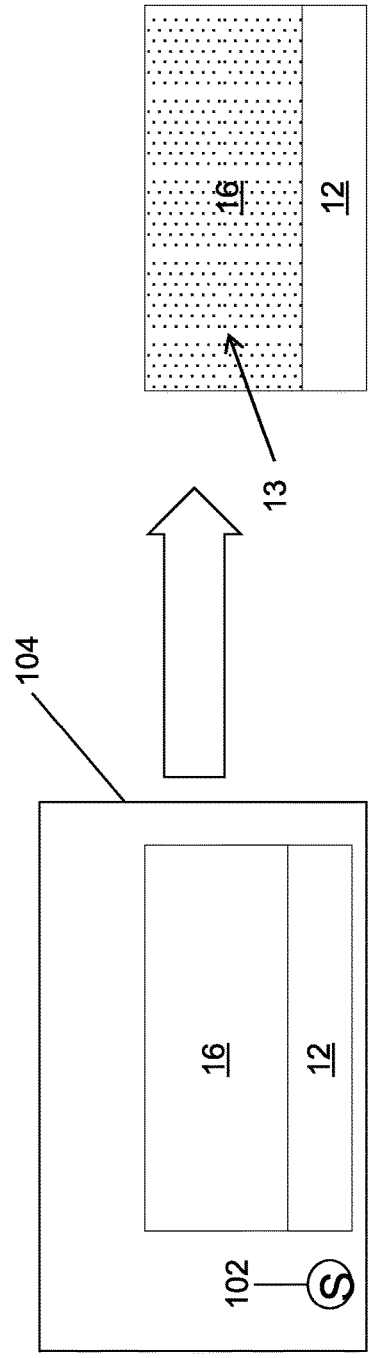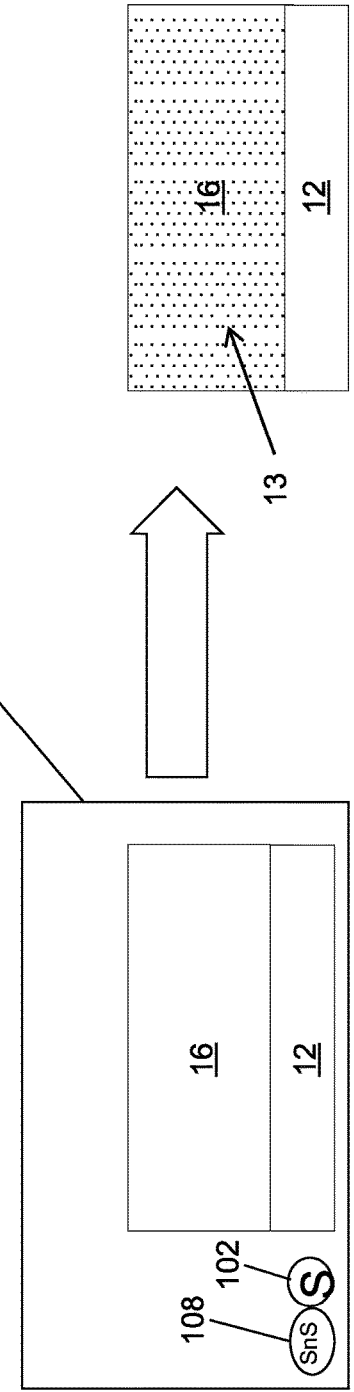

US 9,722,120 B2

BANDGAP GRADING OF CZTS SOLAR CELL

BACKGROUND

Technical Field

The present invention relates to photovoltaic devices, and more particularly to formation methods and devices using absorber layers with a graded bandgap profile.

Description of the Related Art

Cu—In—Ga—S/Se (CIGSSe) technology provides high performance solar cells with very high power conversion efficiency (PCE) (e.g., about 20%). CIGSSe solar cells have a very large open circuit voltage ($V_\alpha$) relative to bandgap with no known issues of interface recombination. Unfortunately, the reliance on rare elements, such as indium, for example, limits very large scale deployment of this technology.

Cu—Zn—Sn—S/Se (CZTSSe) is an emerging thin film solar cell technology consisting of all earth abundant elements. While progress has been made in the development of CZTSSe solar cells particularly using hydrazine-based solution processing, a PCE of only about 12.6% has been achieved.

Several major limitations in CZTSSe solar cells exist as well. For example, a low $V_\alpha$ may be experienced, which is suspected to be due to high buffer-absorber interface recombination, high bulk defect states, existence of tail states in the bulk and possible Fermi level pinning in the bulk or at an interface. Furthermore, CZTSSe also suffers from low fill factor (FF) which is mostly due to low $V_\alpha$ and higher series resistance from various layers or potential barrier formation across the device.

SUMMARY

A method for fabricating a photovoltaic device includes forming a polycrystalline an absorber layer including Cu—Zn—Sn—S(Se) (CZTSSe) over a substrate. The absorber layer is rapid thermal annealed in a sealed chamber having an elemental sulfur source within the chamber. A sulfur content profile is graded in the absorber layer in accordance with an amount of sulfur and an anneal temperature to provide a graduated bandgap profile for the absorber layer. Additional layers are formed on the absorber layer to complete the photovoltaic device.

Another method for fabricating a photovoltaic device includes forming a polycrystalline absorber layer including Cu—Zn—Sn—S(Se) (CZTSSe) over a substrate; placing elemental sulfur in a chamber; placing a secondary phase blocker in the chamber; rapid thermal annealing the absorber layer with the elemental sulfur and the secondary phase blocker in the chamber after being sealed by applying a temperature of between about 290 degrees C. and about 490 degrees C. for about 120 seconds; grading a sulfur content profile in the absorber layer in accordance with a size of the elemental sulfur and an anneal temperature to provide a graduated bandgap profile for the absorber layer; and forming additional layers on the absorber layer to complete the photovoltaic device.

A photovoltaic device includes an absorber layer including Cu—Zn—Sn—S(Se) (CZTSSe) formed on a first contact layer on a substrate, the absorber layer including a graded bandgap across its thickness. A buffer layer is formed in contact with the absorber layer, and a transparent conductive contact layer is formed over the buffer layer formed on the absorber layer.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 1 is a cross-sectional view of a photovoltaic device having a CZTSSe absorber layer with a graded or graduated bandgap in accordance with the present principles;

FIG. 2 is a schematic view showing a sealed chamber having a piece of sulfur and a device with an absorber layer being annealed to form the graded or graduated bandgap in accordance with the present principles;

FIG. 3 is a schematic view showing a sealed chamber having an elemental sulfur source, a secondary phase blocker and a device with an absorber layer being annealed to form the graded or graduated bandgap in accordance with the present principles;

DETAILED DESCRIPTION

Figure 4:
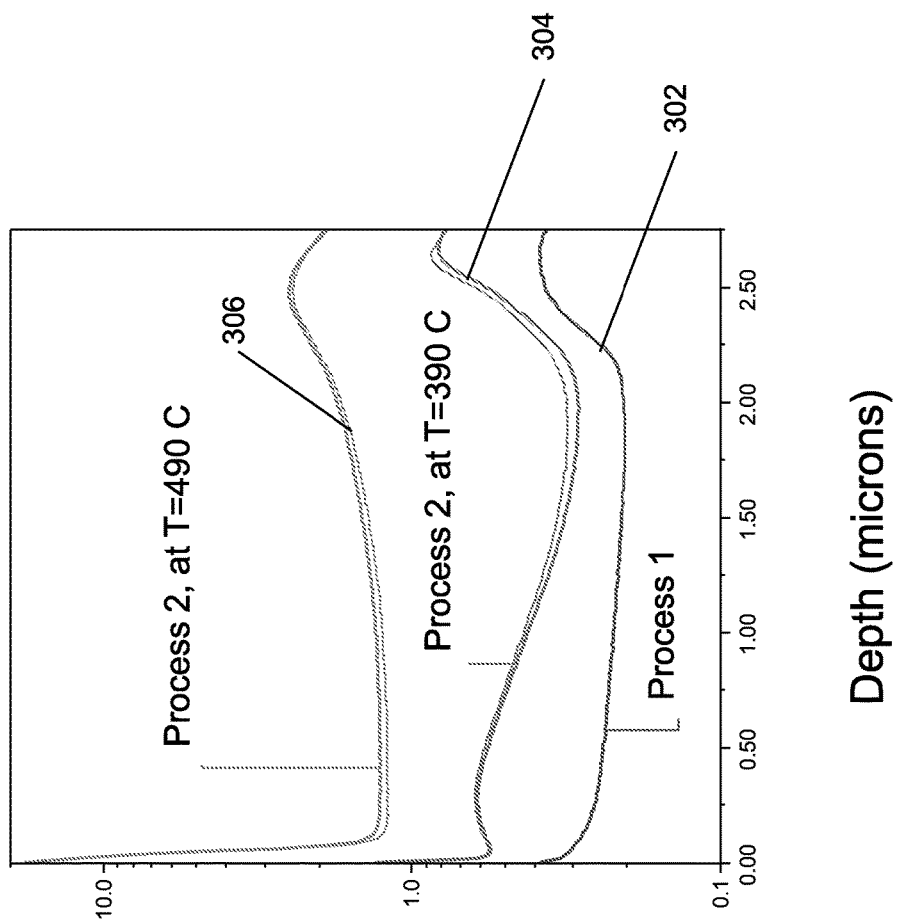
FIG. 4 shows an elemental depth profile by secondary ion mass spectrometry (SIMS) showing S/Se signal ratio versus depth (in microns) across an entire thickness of a CZTSSe absorber film in accordance with the present principles.

In accordance with the present principles, a Cu—Zn—Sn—S/Se (CZTSSe) thin-film high efficiency solar cell is provided with controlled bandgap grading. The controllable bandgap grading of the CZTSSe thin-film includes sulfur in-diffusion by a rapid thermal annealing process under a sulfur ambient environment. The sulfur diffusion amount and profile can be tailored to control the bandgap grading profile. In one embodiment, the sulfur in-diffusion by rapid thermal annealing occurs concurrently with grain size growth. In another embodiment, rapid thermal annealing is performed while controlling secondary sulfur phase formation.

In accordance with the present principles, a $Cu_2(Zn,Sn)(S,Se)_4$ (CZTSSe) photovoltaic device is provided that includes benefits of earth-abundant constituent elements of the CZTSSe and may provide high performance and higher open circuit voltage. Bandgap grading of an absorber layer may include a larger bandgap near the p-n junction or back surface, which is important for improved open-circuit voltage in CZTSSe. The larger bandgap can be achieved by sulfurization without the use of toxic $H_2S$ gases. $H_2S$ gas processes are highly toxic and require a long reaction time (~30 minutes).

Polycrystalline CZTSSe includes grain boundaries that can result in recombination centers and shut paths that can reduce the performance of the CZTSSe device. Annealing the polycrystalline structure increases the size of these grain boundaries and increases performance. CZTSSe and CZTS will be used interchangeably throughout this disclosure. The materials are considered to be equivalent for purposes of this document.

It is to be understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., Cu—Zn—Sn—S(Se) (CZTSSe). The compounds described herein may include different proportions of the elements within the compound, e.g., $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$, etc. In addition, other elements may be included in the compound, such as, e.g., dopants, and still function in accordance with the present principles. The compounds with additional elements will be referred to herein as alloys.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc.

It is also to be understood that the present invention may be employed in a tandem (multi-junction) structure having multiple layers of single crystal absorber layers transferred to a same substrate or layer. Other architectures, structures, substrate materials and process features and steps may be varied within the scope of the present invention. The tandem structure may include one or more stacked cells.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, an illustrative photovoltaic structure 10 is illustratively depicted in accordance with one embodiment. The photovoltaic structure 10 may be employed in solar cells, light sensors, photosensitive devices or other photovoltaic applications. The structure 10 includes a substrate 12. The substrate 12 may include glass or other inexpensive substrates, such as metal, plastic or other material suitable for photovoltaic devices (e.g., quartz, silicon, etc.). A conductive layer 14 is formed on the substrate 12. The conductive layer 14 may include molybdenum although other high work-function materials may be employed (e.g., Pt, Au, etc.). The layer 14 provides a metal contact.

An absorber layer 16 may include a single crystal and/or a polycrystalline CZTSSe layer. Layer 16 includes a Cu—Zn—Sn containing chalcogenide compound with a kesterite structure of the formula: $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$ (hereinafter CZTSSe or CZTS). In a particularly useful embodiment, the Cu—Zn—Sn-containing chalcogenide includes $Cu_2ZnSn(S,Se)_4$. In one embodiment, the CZTSSe film or layer 16 has a thickness of between about 0.2 to 4.0 microns and more preferably about 2 microns. Layer 16 may be grown on the substrate 12 or grown remotely and transferred for placement on the substrate 12 coated with the conductive material 14, such as, Mo.

In one illustrative embodiment, layer 16 includes a band gap ($E_g$) from about 0.9 to 1.5 eV depending on the amount of S. In one embodiment, S concentration is graded, being highest at a top surface, at the p-n junction, and less further from the p-n junction. In another embodiment, S concentration is higher at a front and back surface of the layer 16. An S profile 13 may be linear, exponential or follow any other gradation. The gradation is controlled by, e.g., the amount of S and the anneal temperature during processing. The S diffusion is performed after the absorber layer 16 is formed in a separate process.

Although the major elements in CZTS are Cu, Zn, Sn, S, Se, reference to CZTSSe or Cu—Zn—Sn containing chalcogenide material also includes compositions that optionally contain Ge replacing some or all of the Sn and contain Fe or Cd replacing some or all of the Zn and that may also contain other dopants, including Sb, Bi, Na, K, Li, Ca, etc.

CZTSSe has many benefits. It is low cost and environmentally harmless, being fabricated using naturally abundant materials. CZTSSe provides good optical properties and has a band-gap energy from approximately 0.9 to 1.5 eV, depending on the degree of substitution of S with Se, and a large absorption coefficient in the order of $10^4$-$10^7$ cm$^{-1}$. Reducing the reliance on rare indium metal (also heavily consumed by one of the fastest growing industries—thin film displays) opens the possibility of almost limitless material supply.

A semiconductor material 18 (or buffer layer) may be formed or grown on layer 16, e.g., from groups IV, III-V, II-VI or I-III-VI$_2$. Semiconductor material 18 may include, e.g., GaAs, Cu—In—Ga—S,Se (CIGSSe), CdTe, CdS, ZnS, Ge, etc. Semiconductor material 18 and layer 16 may be formed as polycrystalline or even amorphous material structures, although semiconductor material 18 may include monocrystalline material (grown separately and transferred to the substrate 12).

In one embodiment, CIGSSe is employed for layer 18 and has a chemical formula of $CuIn_xGa_{(1-x)}Se_2$ where the value of x can vary from 1 (pure copper indium selenide) to 0 (pure copper gallium selenide). CIGSSe is a tetrahedrally bonded semiconductor, with the chalcopyrite crystal structure, and a bandgap varying continuously with x from about 1.0 eV (for copper indium selenide) to about 1.7 eV (for copper gallium selenide). CIGSSe as layer 18 provides high performance as the open circuit voltage ($V_{oc}$) provided using this material is very high relative to the bandgap ($E_g$) (e.g., $E_g/q-Voc\sim 0.5$ V). No known issues of interface recombination exist for CIGSSe. In a particularly useful embodiment, layer 18 includes CdS. Other layers or buffer layers may also be employed including, e.g., CdTe, ZnS, Zn(O,S), $In_2S_3$, ZnO, etc.

In some embodiments, layer 18 may include a thickness of between about 0.05 to about 2.0 microns, and the CZTSSe layer 16 may include a thickness of between about 0.2 to about 2.0 microns. Although other thicknesses and combinations are contemplated.

A transparent conductive layer 22 may be formed over the buffer layer 18. The transparent conductive layer 22 may include a transparent conductive oxide (TCO), such as, e.g., indium tin oxide (ITO), aluminum doped zinc oxide (AZO), boron doped zinc oxide (BZO), fluorine doped tin oxide (FTO) or other TCO materials or combinations of these or other materials. The transparent conductive layer 22 may include one or more layers. The one or more layers may include different materials, e.g., ITO and ZnO. The transparent conductive layer 22 may include a thickness of between about 100 nm to about 1-5 microns.

Other layers may be employed to form a contact for the photovoltaic device 10. Metal contacts (not shown) may be formed on the transparent conductive layer 22 to further enhance the conductive properties of the transparent conductive layer 22. The metal contacts may include Ni, Al, Mo, Ag, Au, or any other suitable metal or alloy. Since the metal contacts are on the front, light receiving side of the device 10, their size should be optimized to minimize shadowing loss and resistive loss.

Referring to FIG. 2, a first sulfurization process (process 1 for ease of reference) of absorber layer 16 is illustratively shown in accordance with one embodiment. In this process, grain growth and sulfurization are provided concurrently. In this example, an as-grown $Cu_2ZnSn(S,Se)_4$ thin film 16 is prepared with a thickness of about 2 microns and having small grain size (e.g., less than about 500 nm) on a substrate 12. A rapid thermal anneal (RTA) process is performed preferably about 590 degrees C. for 120 seconds, although a temperature between about 370 degrees C. to about 640 degrees C. may be employed for a corresponding duration depending on temperature. The RTA is performed in a sealed chamber 104 under a sulfur ambient. Sulfur species may include e.g., $S_x$ where x=2, 3, 4, 5, 6, 7, 8 with $S_2$ being preferred. The sulfur diffuses into the film 16 (e.g., $Cu_2ZnSn(S,Se)_4$) during the RTA. In one embodiment, the RTA is performed with an elemental piece 102 of sulfur in the sealed chamber 104.

The process concurrently grows grain size and provides sulfur in-diffusion for the film 16. The size of the sulfur piece 102 controls the amount of sulfur diffusion during the RTA. The larger the piece 102 (more surface area/higher partial pressure achieved) the higher the concentration of S in the film 16 over a given anneal time. The concentration of the S (S profile 13) can be controlled by sulfur partial pressure in the chamber with precision using the size of the piece of sulfur 102 and the anneal temperature and time. The piece of sulfur 102 may have its size controlled by its shape and dimensions. The surface area of the piece of sulfur 102 may be selected based on the shape, e.g., thin film, cube, sphere, cylinder, area open within a container, etc.) and the size dimension of a side, radius/diameter, exposed surface area in the container or film, etc.

Referring to FIG. 3, a second sulfurization process (process 2 for ease of reference) of absorber layer 16 is illustratively shown in accordance with another embodiment. In this process, grain growth and sulfurization are provided separately. In this example, an as-grown $Cu_2ZnSn(S,Se)_4$ thin film 16 is prepared with a thickness of about 2 microns and having a large grain size (e.g., greater than about 500 nm).

A rapid thermal anneal (RTA) process is performed preferably between about 290 degrees C.-about 490 degrees C. for 120 seconds. The RTA is performed in a sealed chamber 104 with sulfur ambient and sulfur species control. A sulfur species control material 108 may be provided using a sulfur compound, such as e.g., SnS although other compounds may be employed. In one embodiment, the elemental sulfur 102 may include, e.g., 1-10 mg of sulfur, the control material 108 may include 0.1-1 mg of SnS in a chamber volume of 10-100 cm$^3$.

In one embodiment, the RTA is performed with sulfur 102 and a secondary phase blocker 108 in the sealed chamber 104. The secondary phase blocker 108 is employed to minimize secondary phase formation of S compounds in the chamber 104. Sulfur species may include e.g., $S_x$ where x=2, 3, 4, 5, 6, 7, 8 with $S_2$ being preferred. The secondary phase blocker 108 may include SnS or other metal sulfide compounds. The sulfur diffuses into the film 16 (e.g., $Cu_2ZnSn(S,Se)_4$ during the RTA.

This process provides sulfur in-diffusion for the film 16, which includes large grains already. The size of the sulfur piece 102 controls the amount of sulfur diffusion during the RTA. The size of the SnS piece 108 controls the amount of secondary species formed in the chamber 104 during the RTA. The larger the piece 102 (higher sulfur partial pressure), the higher the concentration of S in the film 16 over a given anneal time. The concentration of the S can be controlled with precision using the size of the piece of sulfur 102 and the anneal temperature and time. The size/surface area of the piece of sulfur 102 and the blocker 108 may be selected based on the shape, e.g., thin film, cube, sphere, cylinder, area open within a container, etc.) and the size dimension of a side, radius/diameter, exposed surface area in the container or film, etc.

Referring to FIG. 4, an elemental depth profile by secondary ion mass spectrometry (SIMS) shows a S/Se signal ratio versus depth (in microns) across an entire thickness of a CZTSSe absorber film. Zero depth corresponds to the p-n junction in the photovoltaic device. A graded S/Se profile is confirmed by the SIMS measurement.

A profile 302 was created in accordance with process 1 and shows a S-rich phase in a front region (about zero depth) and back surface region (about 2.5 micron depth). Process 1 provides a S/Se ratio of between about 0.2 to about 0.4 in the first 0.25 microns.

A profile 304 was created in accordance with process 2 with and anneal temperature of 390 degrees C. and shows a S-rich phase in a front region (about zero depth) and back surface region (about 2.5 micron depth). Profile 304 provides a S/Se ratio of between about, e.g., 0.55 to about 1.2 in the first 0.25 microns.

A profile 306 was created in accordance with process 2 with an anneal temperature of 490 degrees C. and shows a S-rich phase in a front region (about zero depth) and back surface region (about 2.5 micron depth). Profile 306 provides a dramatic increase in S content in the first 0.25 microns and provides a S/Se ratio of between about, e.g., 1.2 to about 11 in the first 0.25 microns. The SIMS data for process 2 shows a strong increase (e.g., 5-10×) in relative S/Se ratio upon high-T sulfurization throughout the entire CZTS absorber layer.

Figure 5:
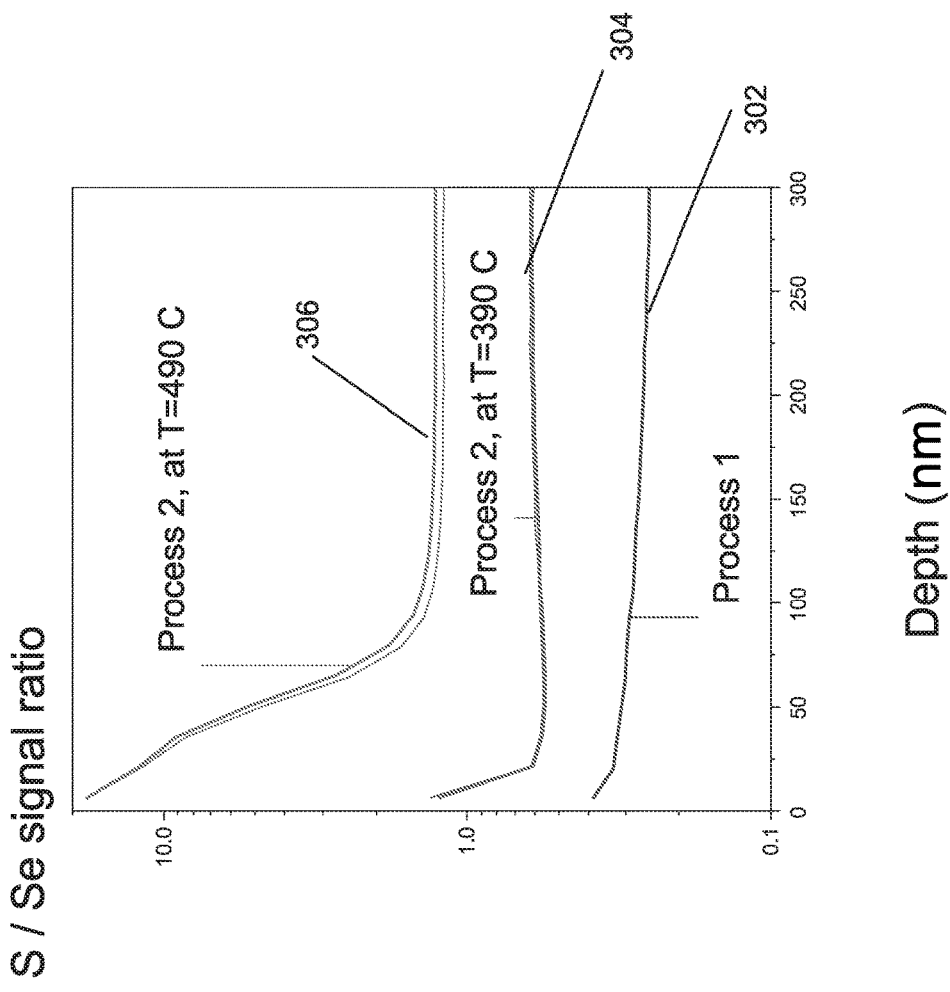
FIG. 5 shows an elemental depth profile by SIMS showing S/Se signal ratio versus depth (in nm) near a surface region of the CZTSSe absorber film in accordance with the present principles.

Referring to FIG. 5, the SIMS data of FIG. 4 is shown in greater detail near a surface region. FIG. 5 shows S/Se signal ratio versus depth (in nm) across surface region (up to 300 nm) of the CZTSSe absorber film. Zero depth corresponds to the p-n junction in the photovoltaic device. The profile 302 created in accordance with process 1 shows the S-rich phase close to the front region (about zero depth) and provides the S/Se ratio of between about 0.2 to about 0.4 in the first 50 nm.

The profile 304 was created in accordance with process 2 with an anneal temperature of 390 degrees C. and shows the S-rich phase in the front region (about zero depth). Profile 304 provides a S/Se ratio of between about, e.g., 0.55 to about 1.2 in the first 50 nm.

The profile 306 was created in accordance with process 2 with an anneal temperature of 490 degrees C. and shows the S-rich phase in a front region (about zero depth). Profile 306 provides a dramatic increase in S content and provides a S/Se ratio of between about, e.g., 1.2 to about 11 in the first 100 microns.

Figure 6:
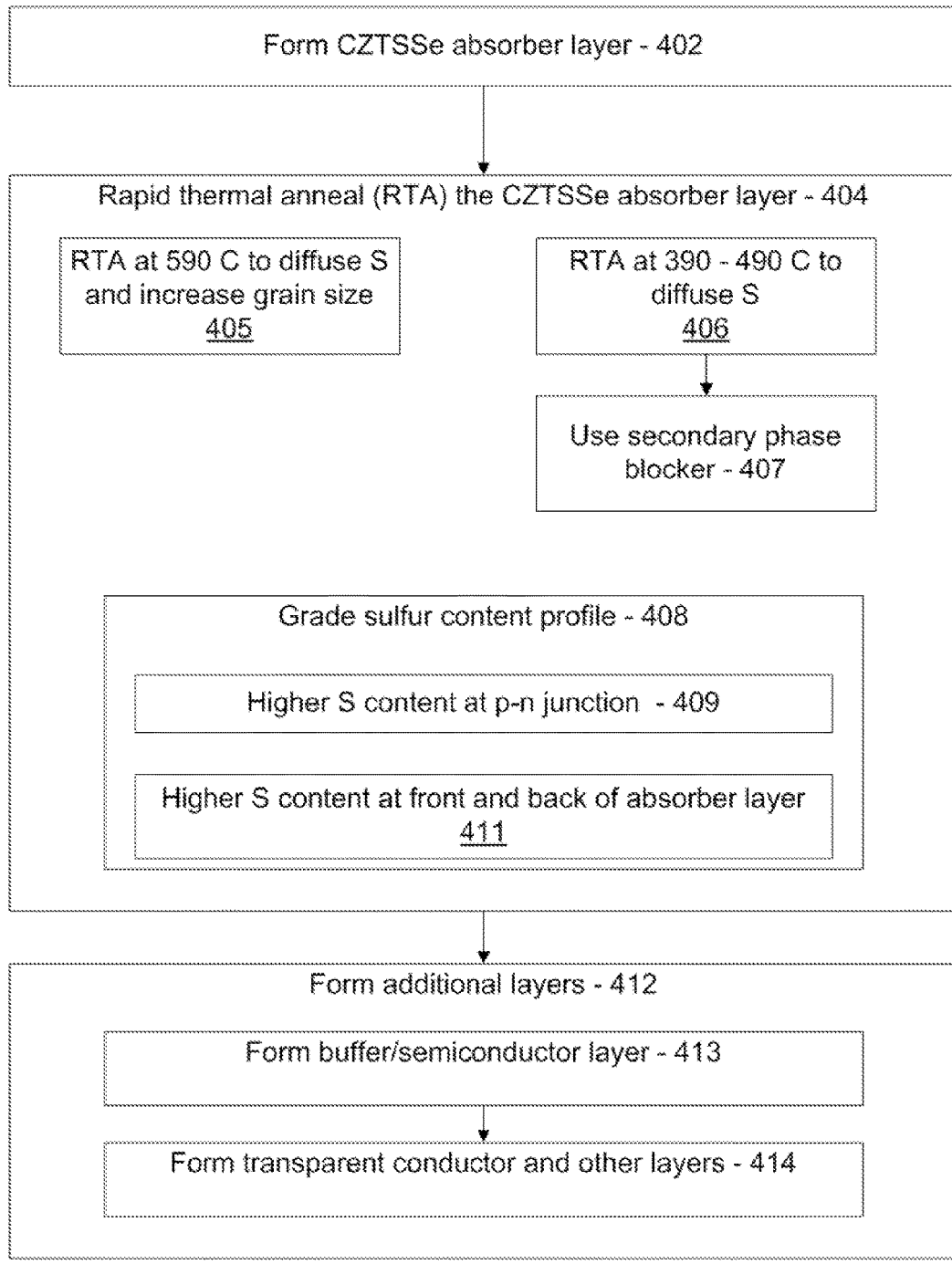
FIG. 6 is a block/flow diagram showing a method for forming a photovoltaic device with a graded bandgap absorber layer in accordance with illustrative embodiments.

Referring to FIG. 6, a method for fabricating a photovoltaic device is illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 402, a polycrystalline absorber layer including Cu—Zn—Sn—S(Se) (CZTSSe) is formed over a substrate. In block 404, the absorber layer is rapid thermal annealed in a sealed chamber having elemental sulfur within the chamber.

In one embodiment, in block 405, the rapid thermal anneal includes a temperature of about 590 degrees C. for about 120 seconds to diffuse sulfur and concurrently increase grain size of grains in the absorber layer, e.g., CZTSSe.

In another embodiment, in block 406, the rapid thermal anneal includes a temperature of between about 290 degrees C. and about 490 degrees C. for about 120 seconds. The CZTSSe absorber layer preferably includes larger grain size prior to the rapid thermal anneal. This may be provided by a separate heat treatment to grow grains or the grains may be larger during as-formed processing. In block 407, secondary phase formation of sulfur compounds is controlled in the chamber. A secondary phase formation blocker in the chamber may include placing a piece of SnS in the chamber. The sulfur content and profile can be controlled by controlling the size/shape (partial pressure) of the sulfur and the anneal conditions (e.g., temperature and duration).

In block 408, a sulfur content profile is graded in the absorber layer in accordance with a size of the elemental sulfur and an anneal temperature to provide a graduated bandgap profile for the absorber layer. In block 409, the sulfur content profile includes higher sulfur content at a p-n junction. In block 411, the sulfur content profile includes higher sulfur content at a front surface and a back surface of the absorber layer.

In block 412, additional layers are formed on the absorber layer to complete the photovoltaic device. In block 413, a buffer/semiconductor layer is formed on the absorber layer. The buffer/semiconductor layer may include multiple layers. In block 414, a transparent conductor is formed over the semiconductor layer. Other layers may also be employed.

Having described preferred embodiments for bandgap grading of CZTS solar cell (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for fabricating a photovoltaic device, comprising:
forming a polycrystalline absorber layer including Cu—Zn—Sn—S(Se) (CZTSSe) over a substrate, wherein the absorber layer has a front surface;
rapid thermal annealing the absorber layer in a sealed chamber having a piece of elemental sulfur within the chamber, wherein the elemental sulfur is located other than on the front surface of the absorber layer;
grading a sulfur content profile in the absorber layer in accordance with a shape and dimensions of the piece of elemental sulfur and an anneal temperature to provide a graduated bandgap profile for the absorber layer; and
forming additional layers on the absorber layer to complete the photovoltaic device.

2. The method as recited in claim 1, wherein rapid thermal annealing includes applying a temperature of about 590 degrees C. for about 120 seconds to concurrently increase grain size of grains in the absorber layer.

3. The method as recited in claim 1, wherein rapid thermal annealing includes applying a temperature of between about 290 degrees C. and about 490 degrees C. for about 120 seconds.

4. The method as recited in claim 1, wherein rapid thermal annealing includes increasing grain size for the CZTSSe in the absorber layer.

5. The method as recited in claim 1, wherein grading the sulfur content profile includes higher sulfur content at a junction with the additional layers.

6. The method as recited in claim 1, wherein grading the sulfur content profile includes higher sulfur content at the front surface and a back surface of the absorber layer.

7. The method as recited in claim 1, further comprising controlling secondary phase formation of sulfur compounds in the chamber.

8. The method as recited in claim 7, wherein controlling secondary phase formation of sulfur compounds in the chamber includes placing a piece of SnS in the chamber.

9. The method as recited in claim 1, wherein forming additional layers on the absorber layer includes:
forming a semiconductor layer on the absorber layer; and
forming a transparent conductor over the semiconductor layer.

10. A method for fabricating a photovoltaic device, comprising:
forming a polycrystalline absorber layer including Cu—Zn—Sn—S(Se) (CZTSSe) over a substrate, wherein the absorber layer has a front surface;
placing a piece of elemental sulfur in a chamber, wherein the elemental sulfur is located other than on the front surface of the absorber layer;
placing a secondary phase blocker in the chamber;
rapid thermal annealing the absorber layer with the elemental sulfur and the secondary phase blocker in the chamber after being sealed by applying a temperature of between about 290 degrees C. and about 490 degrees C. for about 120 seconds;
grading a sulfur content profile in the absorber layer in accordance with a shape and dimensions of the piece of elemental sulfur and an anneal temperature to provide a graduated bandgap profile for the absorber layer; and
forming additional layers on the absorber layer to complete the photovoltaic device.

11. The method as recited in claim 10, wherein grading the sulfur content profile includes higher sulfur content at a junction with the additional layers.

12. The method as recited in claim 10, wherein grading the sulfur content profile includes higher sulfur content at the front surface and a back surface of the absorber layer.

13. The method as recited in claim 10, wherein placing the secondary phase blocker includes placing a piece of SnS in the chamber.

14. The method as recited in claim 10, wherein forming additional layers on the absorber layer includes:
forming a semiconductor layer on the absorber layer; and
forming a transparent conductor over the semiconductor layer.

* * * * *